United States Patent
Wang et al.

(10) Patent No.: US 10,331,254 B2
(45) Date of Patent: Jun. 25, 2019

(54) TOUCH ORGANIC LIGHT-EMITTING DIODE DISPLAY DEVICE AND TOUCH DEVICE

(71) Applicant: Coretronic Corporation, Hsin-Chu (TW)

(72) Inventors: Wen-Chun Wang, Hsin-Chu (TW); Chia-Chia Lin, Hsin-Chu (TW); Li-Chun Tai, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 0 days.

(21) Appl. No.: 15/668,703

(22) Filed: Aug. 4, 2017

(65) Prior Publication Data

US 2018/0046294 A1 Feb. 15, 2018

(30) Foreign Application Priority Data

Aug. 9, 2016 (TW) .............................. 105212047 U

(51) Int. Cl.
*G06F 3/041* (2006.01)
*H01L 27/32* (2006.01)
*H01L 51/52* (2006.01)

(52) U.S. Cl.
CPC .......... *G06F 3/0412* (2013.01); *G06F 3/0416* (2013.01); *H01L 27/323* (2013.01); *H01L 51/5253* (2013.01); *H01L 51/5281* (2013.01); *G06F 2203/04111* (2013.01)

(58) Field of Classification Search
CPC combination set(s) only.
See application file for complete search history.

(56) References Cited

U.S. PATENT DOCUMENTS

| 2014/0192277 A1* | 7/2014 | Yilmaz | G06F 3/0412 349/12 |
| 2016/0085100 A1* | 3/2016 | Toyoshima | G02F 1/13363 349/12 |
| 2017/0069692 A1* | 3/2017 | Lee | H01L 27/323 |
| 2017/0133436 A1* | 5/2017 | Wang | H01L 27/323 |

FOREIGN PATENT DOCUMENTS

| CN | 1858641 | 11/2006 |
| CN | 103530007 | 1/2014 |
| CN | 105389049 | 3/2016 |
| TW | 201519431 | 5/2015 |

* cited by examiner

*Primary Examiner* — Temesghen Ghebretinsae
*Assistant Examiner* — Sosina Abebe
(74) *Attorney, Agent, or Firm* — JCIPRNET

(57) ABSTRACT

A touch organic light-emitting diode display device including an organic light-emitting diode display, a touch panel, and a linear polarizing layer is provided. The touch panel is disposed on the organic light-emitting diode display, and the touch panel includes a substrate, a driving electrode, a sensing electrode, and a dielectric layer. The driving electrode is adapted to transmit a driving signal, and the sensing electrode is adapted to receive a sensing signal. The driving electrode and the sensing electrode are disposed to be insulated from each other, and the dielectric layer is connected to at least one of the driving electrode and the sensing electrode. The dielectric layer has a one-quarter wavelength phase delay amount, and the dielectric layer is formed by coating. The linear polarizing layer is disposed at one side of the touch panel away from the organic light-emitting diode display. Besides, a touch device is also provided.

14 Claims, 5 Drawing Sheets

TOUCH ORGANIC LIGHT-EMITTING DIODE DISPLAY DEVICE AND TOUCH DEVICE

CROSS-REFERENCE TO RELATED APPLICATION

This application claims the priority benefit of Taiwan application serial no. 105212047, filed on Aug. 9, 2016. The entirety of the above-mentioned patent application is hereby incorporated by reference herein and made a part of this specification.

BACKGROUND OF THE INVENTION

Field of the Invention

The invention relates to a display device and a touch device, and particularly relates to a touch organic light-emitting diode display device and a touch device.

Description of Related Art

In recent years, with the development of science and technology, many input devices of information products have been changed from a traditional keyboard or mouse to a touch panel. Additionally, display related technology also continues to improve, including such as the technology of organic light-emitting diode displays with power saving, flexibility, and other properties has gradually matured. To meet the needs of information product display screen and user input data at the same time, there have been products which combines the touch panel with the organic light-emitting diode display nowadays, so as to achieve a display function and a touch function at the same time.

Generally speaking, a material of a cathode of the organic light-emitting diode is a metal material (e.g., silver, aluminum), of which reflection capability for ambient light is high, such that contrast performance of the display is poor. The common technology for ambient light interference resistance is that, a composite film, which is composed of a linear absorption polarizing sheet and a one-quarter wavelength phase retardation film, is attached to a surface of the organic light-emitting diode display. Thus, the ambient light is polarized to linear polarized light when entering the linear polarizing sheet, and half of light is absorbed by the polarizing sheet at the same time. Additionally, the one-quarter wavelength phase retardation film will change the linear polarized light to circular polarized light. When the ambient light is reflected by metal to pass through the one-quarter wavelength phase retardation film once again, it will be changed to the linear polarized light again, and enter the linear polarizing sheet. At this time, a polarization direction of the linear polarized light passing through the linear polarizing sheet at the second time is perpendicular to a polarization direction of the linear polarized light passing through the linear polarizing sheet at the first time, and it is just an absorption axis direction. Thereby, the ambient light reflected by the cathode of the organic light-emitting diode can be eliminated. However, since the aforementioned composite film includes the linear polarizing sheet and the one-quarter wavelength phase retardation film, which has a certain thickness, the product thickness of the touch organic light-emitting diode display with the aforementioned composite film is not easy to reduce currently.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention was acknowledged by a person of ordinary skill in the art.

SUMMARY OF THE INVENTION

The invention provides a touch organic light-emitting diode display device, which can resist ambient light interference and have a thin thickness.

The invention provides a touch device. When the touch device is used combined with other displays, the touch device can resist ambient light interference. Also, the touch device has a thin thickness.

The other objectives and advantages of the invention can be further understood through the technical features disclosed in the invention.

In order to achieve at least one of the above-mentioned objectives, an embodiment of the invention provides a touch organic light-emitting diode display device including an organic light-emitting diode display, a touch panel, and a linear polarizing layer. The touch panel is disposed on the organic light-emitting diode display, and the touch panel includes a substrate, a driving electrode, a sensing electrode, and a dielectric layer. The driving electrode is disposed at the substrate, and the driving electrode is adapted to transmit a driving signal. The sensing electrode is adapted to receive a sensing signal, and the driving electrode and the sensing electrode are disposed to be insulated from each other. The dielectric layer is connected to at least one of the driving electrode and the sensing electrode. The dielectric layer has a one-quarter wavelength phase delay amount, and the dielectric layer is formed by coating. The linear polarizing layer is disposed at one side of the touch panel away from the organic light-emitting diode display.

In order to achieve at least one of the above-mentioned objectives, an embodiment of the invention provides a touch device including a touch panel and a linear polarizing layer. The touch panel includes a substrate, a driving electrode, a sensing electrode, and a dielectric layer. The driving electrode is disposed at the substrate, and the driving electrode is adapted to transmit a driving signal. The sensing electrode is adapted to receive a sensing signal, and the driving electrode and the sensing electrode are disposed to be insulated from each other. The dielectric layer is connected to at least one of the driving electrode and the sensing electrode. The dielectric layer has a one-quarter wavelength phase delay amount, and the dielectric layer is formed by coating. The linear polarizing layer is disposed on the touch panel.

Based on the above, the embodiments of the invention have at least one of the advantages or effects below. In the touch organic light-emitting diode display device of the embodiment of the invention, the dielectric layer is connected to at least one of the driving electrode and the sensing electrode. The dielectric layer has the one-quarter wavelength phase delay amount, and the dielectric layer is formed by coating. Therefore, the dielectric layer can be used with the linear polarizing layer to realize circular polarization, thereby eliminating the ambient light reflected by the organic light-emitting diode display, so that the touch organic light-emitting diode display device can resist the ambient light interference. Additionally, since an extra one-quarter wavelength phase retardation film is not required to be attached to the touch organic light-emitting diode display device, the touch organic light-emitting diode display device has a thin thickness. Besides, when the touch device of the embodiment of the invention is used combined with the display, the dielectric layer of the touch device can be used with the linear polarizing layer to realize circular polarization, thereby eliminating the ambient light reflected by the display, so as to resist the ambient light interference. Additionally, the touch device has a thin thickness.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description of the preferred embodiments, reference is made to the accompanying drawings which form in a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1A:
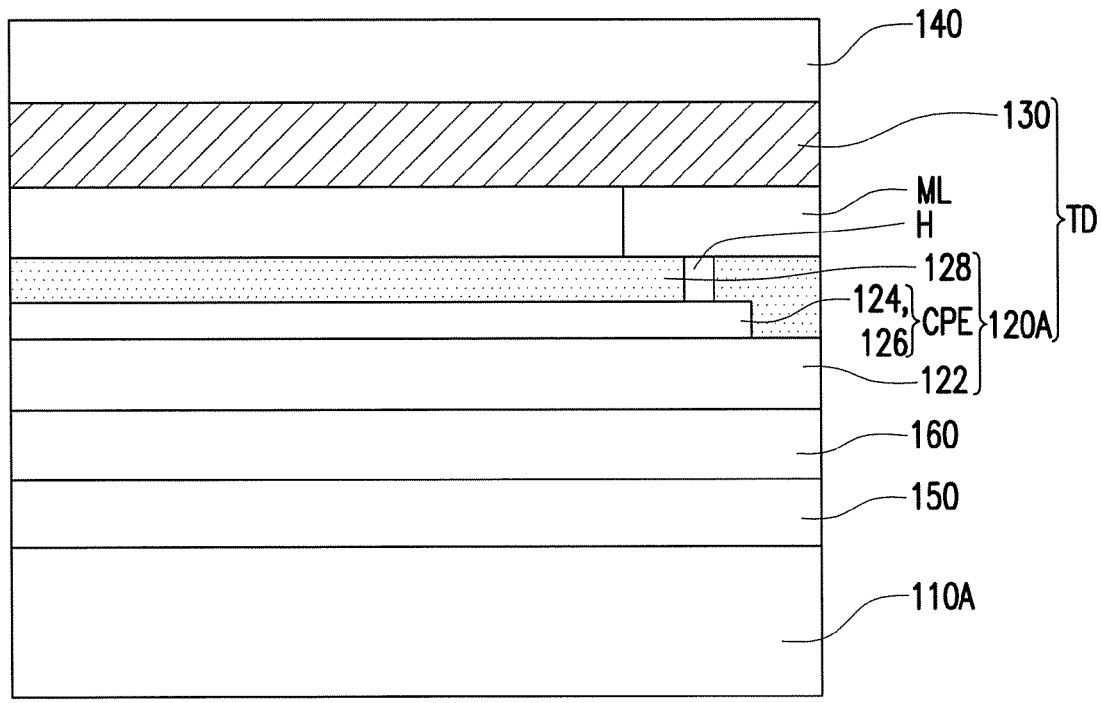
FIG. 1A to FIG. 1D are schematic cross-sectional views illustrating touch organic light-emitting diode display devices according to some embodiments of the invention.

FIG. 1A to FIG. 1D are schematic cross-sectional views illustrating touch organic light-emitting diode display devices according to some embodiments of the invention. Referring to FIG. 1A, in the embodiment, a touch organic light-emitting diode display device 100A includes an organic light-emitting diode (OLED) display 110A and a touch device TD. The touch device TD includes a touch panel 120A and a linear polarizing layer 130. The touch panel 120A is disposed on the organic light-emitting diode display 110A, and the linear polarizing layer 130 is disposed on the touch panel 120A. In particular, the linear polarizing layer 130 is disposed at one side of the touch panel 120A away from the organic light-emitting diode display 110A. That is, the touch panel 120A is located between the linear polarizing layer 130 and the organic light-emitting diode display 110A. In other embodiments, the organic light-emitting diode display 110A may also be changed to use other types of displays, such as a liquid crystal display (LCD), a plasma display, an electrowetting display (EWD), an electro-phoretic display (EPD), an electrochromic display (ECD), or other applicable displays, and the invention is not limited thereto.

In the embodiment, the touch panel 120A includes a substrate 122, a driving electrode 124, a sensing electrode 126, and a dielectric layer 128. The driving electrode 124 is adapted to transmit a driving signal, and the sensing electrode 126 is adapted to receive a sensing signal. The driving electrode 124 is disposed at the substrate 122, and the sensing electrode 126 is also disposed at the substrate 122. In particular, the substrate 122 is a light-transmissive substrate. Thus, an image light beam from the organic light-emitting diode display 110A may be transmitted out through the substrate 122. The substrate 122 is an optical clear film, for example, and a material thereof is a cyclic olefin copolymer (COC), a cyclic olefin polymer (COP), polyethylene terephthalate (PET), or other types of optical clear films, and the invention is not limited thereto.

In the embodiment, the driving electrode 124 and the sensing electrode 126 are disposed at one side of the substrate 122 facing the linear polarizing layer 130, and the driving electrode 124 and the sensing electrode 126 respectively form a plurality of electrode patterns at the substrate 122. The electrode patterns of the driving electrode 124 are not in contact with the electrode patterns of the sensing electrode 126. That is, the driving electrode 124 and the sensing electrode 126 are disposed to be insulated from each other. In particular, the driving electrode 124 and the sensing electrode 126 of the embodiment belong to one layer solution type (OLS type) of electrode structure. That is, the driving electrode 124 and the sensing electrode 126 are a coplanar electrode layer CPE. The driving electrode 124 and the sensing electrode 126 are disposed on a surface of the same side of the substrate 122, and are made from the same conductive material layer. Furthermore, in the embodiment, the coplanar electrode layer CPE is disposed between the linear polarizing layer 130 and the substrate 122. Additionally, in other embodiments, the driving electrode 124 and the sensing electrode 126 may also have other types of electrode structures, and the invention is not limited thereto.

In the embodiment, the dielectric layer 128 is connected to at least one of the driving electrode 124 and the sensing electrode 126, and the dielectric layer 128 is formed by coating. In particular, the dielectric layer 128 covers surfaces of the driving electrode 124 and the sensing electrode 126, and the dielectric layer 128 is further formed between the driving electrode 124 and the sensing electrode 126. That is, the dielectric layer 128 insulates and separates the driving electrode 124 from the sensing electrode 126. However, in other embodiments, the driving electrode 124 may be insulated from the sensing electrode 126 by other insulating layers therebetween, and the dielectric layer 128 only covers on the driving electrode 124 and the sensing electrode 126. The invention is not limited thereto.

Additionally, in the embodiment, the touch panel 120A further includes a metal layer ML disposed in a border area (not shown) of the touch organic light-emitting diode display device 100A. In the embodiment, the metal layer ML may be patterned to be circuit traces of the touch panel 120A. The metal layer ML is disposed above the dielectric layer 128, and the metal layer ML is electrically connected to the driving electrode 124 and the sensing electrode 126 respectively through a conductive through hole H penetrating the dielectric layer 128. In particular, the metal layer ML is electrically connected to at least a portion of the electrode patterns of the driving electrode 124 and the sensing electrode 126 through the conductive through holes H, such that at least a portion of the electrode patterns of the driving electrode 124 is electrically connected to each other. Additionally, the metal layer ML is electrically connected to external circuits (not shown). Therefore, the driving signal provided from the external circuits may be transmitted to the driving electrode 124 through the metal layer ML. With the sensing signal, which is generated from touch behavior, received by the sensing electrode 126 which may be returned to the external circuits through the metal layer ML, the touch panel 120A can achieve the function of touch sensing.

Continuing referring to FIG. 1A, in particular, the organic light-emitting diode display 110A of the touch organic light-emitting diode display device 100A is encapsulated by encapsulated glass 150, for example, so as to prevent moisture and oxygen from entering organic light-emitting diode elements (not shown) in the organic light-emitting diode display 110A. The encapsulated glass 150 is disposed between the touch panel 120A and the organic light-emitting diode display 110A. Also, an adhesive layer 160 is disposed between the touch panel 120A and the encapsulated glass 150, which is used to adhere the touch panel 120A and the encapsulated glass 150 (and the organic light-emitting diode display 110A), so as to integrate the touch panel 120A and the organic light-emitting diode display 110A. In particular, in other embodiments, the organic light-emitting diode display 110A may also be encapsulated by other encapsulating materials, such as flexible encapsulating materials, and the invention is not limited thereto.

In the embodiment, the linear polarizing layer 130, which is disposed on the touch panel 120A, is a polarizing film, for example, which can be formed by coating. When a light (e.g., an ambient light from outside of the touch organic light-emitting diode display device 100A) passes through the linear polarizing layer 130, linear polarization of the light can be realized by the linear polarizing layer 130. Additionally, the touch organic light-emitting diode display device 100A further includes a scratch resistant layer 140. The scratch resistant layer 140 is a hard coating layer, for example, which is used to reinforce mechanical strength and hardness of the linear polarizing layer 130. Besides, the dielectric layer 128 in the touch panel 120A has a one-quarter wavelength phase delay amount. When a light (e.g., an ambient light from outside of the touch organic light-emitting diode display device 100A) passes through the dielectric layer 128, the phase of the light will delay one-quarter wavelength.

In particular, the dielectric layer 128 may be used with the linear polarizing layer 130 to realize circular polarization. When entering the linear polarizing layer 130, the ambient light from outside of the touch organic light-emitting diode display device 100A is polarized to a linear polarized light. At the same time, half of the ambient light is absorbed by the linear polarizing layer 130. Additionally, when the ambient light passes through the dielectric layer 128, it will be converted to a circular polarized light by the dielectric layer 128. Then, the ambient light is reflected at the organic light-emitting diode display 110A, for example, reflected by the metal electrode of the organic light-emitting diode display 110A, and enters the dielectric layer 128 once again. Thereafter, the ambient light will be converted to a linear polarized light by the dielectric layer 128 again, and enters the linear polarizing layer 130. At this time, a polarization direction of the ambient light passing through the linear polarizing layer 130 at the second time is perpendicular to a polarization direction of the ambient light passing through the linear polarizing layer 130 at the first time, and it is just an absorption axis direction. Thereby, the dielectric layer 128 can be used with the linear polarizing layer 130 to realize circular polarization and eliminate the ambient light reflected by the organic light-emitting diode display 110A, such that the touch organic light-emitting diode display device 100A can resist the ambient light interference.

Generally speaking, a conventional touch organic light-emitting diode display device needs to realize circular polarization through the linear polarizing sheet and the one-quarter wavelength phase retardation film, and a thickness of a general one-quarter wavelength phase retardation film is at least 86 micrometers. A thickness of the substrate 122 plus the dielectric layer 128 of the touch organic light-emitting diode display device 100A of the embodiment is merely about 55 micrometers by comparison. In particular, since an extra one-quarter wavelength phase retardation film is not required to be attached to the touch organic light-emitting diode display device 100A of the embodiment, the touch organic light-emitting diode display device 100A has a thin thickness. For example, the thickness of the touch organic light-emitting diode display device 100A having the one layer solution type of electrode structure of the embodiment subtracted by the thickness of the organic light-emitting diode display 110A is equal to about 101 micrometers. The thickness of a conventional touch organic light-emitting diode display device having the one layer solution type of electrode structure subtracted by the thickness of the organic light-emitting diode display is equal to about 223 micrometers by comparison. Thus, the thickness of the touch organic light-emitting diode display device 100A of the embodiment is reduced by 54.7% compared with that of the conventional structure. Additionally, in the embodiment, the touch device TD of the touch organic light-emitting diode display device 100A can be used combined with different organic light-emitting diode displays or other displays. Also, the touch device TD includes the dielectric layer 128 and the linear polarizing layer 130 which can realize the circular polarization. Thus, the touch device TD can eliminate the ambient light reflected by the organic light-emitting diode display or other displays, so as to resist the ambient light interference. Additionally, the touch device TD has a thin thickness.

Figure 1B:
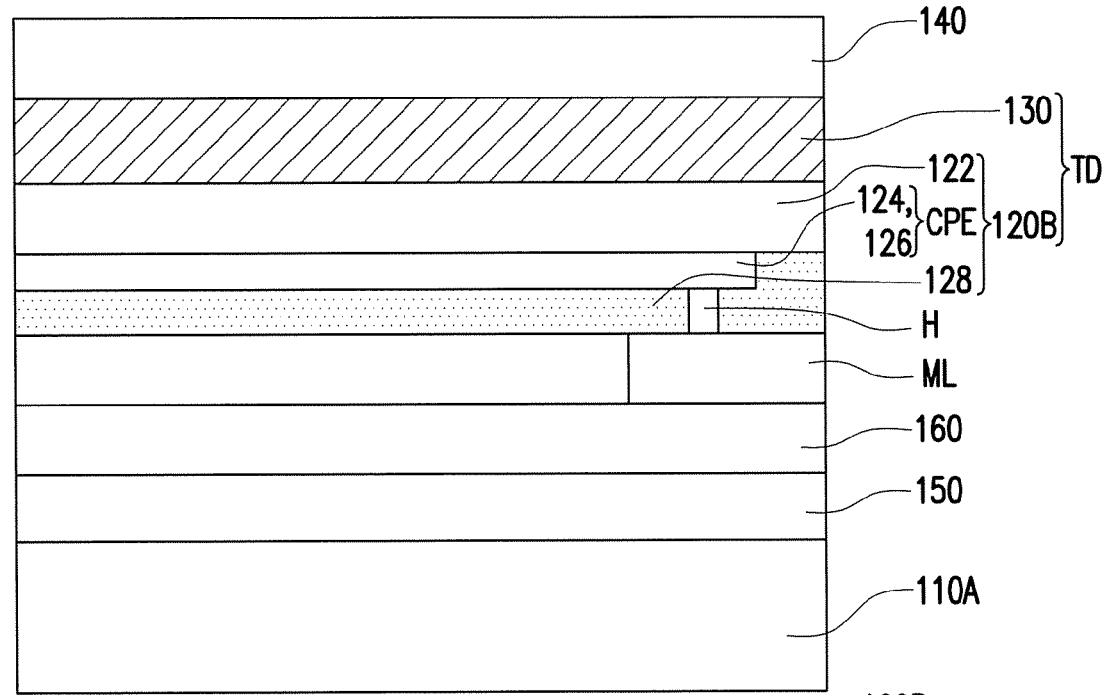

Referring to FIG. 1B, a touch organic light-emitting diode display device 100B of the embodiment in FIG. 1B is similar to the touch organic light-emitting diode display device 100A of the embodiment in FIG. 1A, of which elements and related descriptions can be referred to the touch organic light-emitting diode display device 100A of the embodiment in FIG. 1A, and is not repeated herein. The differences between the touch organic light-emitting diode display device 100B and the touch organic light-emitting diode display device 100A are described below. In the embodiment, the driving electrode 124 and the sensing electrode 126 of the organic light-emitting diode display device 100B are the coplanar electrode layer CPE, and the substrate 122 is disposed between the linear polarizing layer 130 and the coplanar electrode layer CPE. In particular, the driving electrode 124 and the sensing electrode 126 of the embodiment are disposed at one side of the substrate 122 away from the linear polarizing layer 130, which is different from the driving electrode 124 and the sensing electrode 126 of the embodiment in FIG. 1A, which are disposed at one side of the substrate 122 facing the linear polarizing layer 130. In the embodiment, the touch organic light-emitting diode display device 100B and the touch device TD may also have similar effects described in the embodiment of FIG. 1A, which can resist the ambient light interference, and have a thin thickness.

Figure 1C:
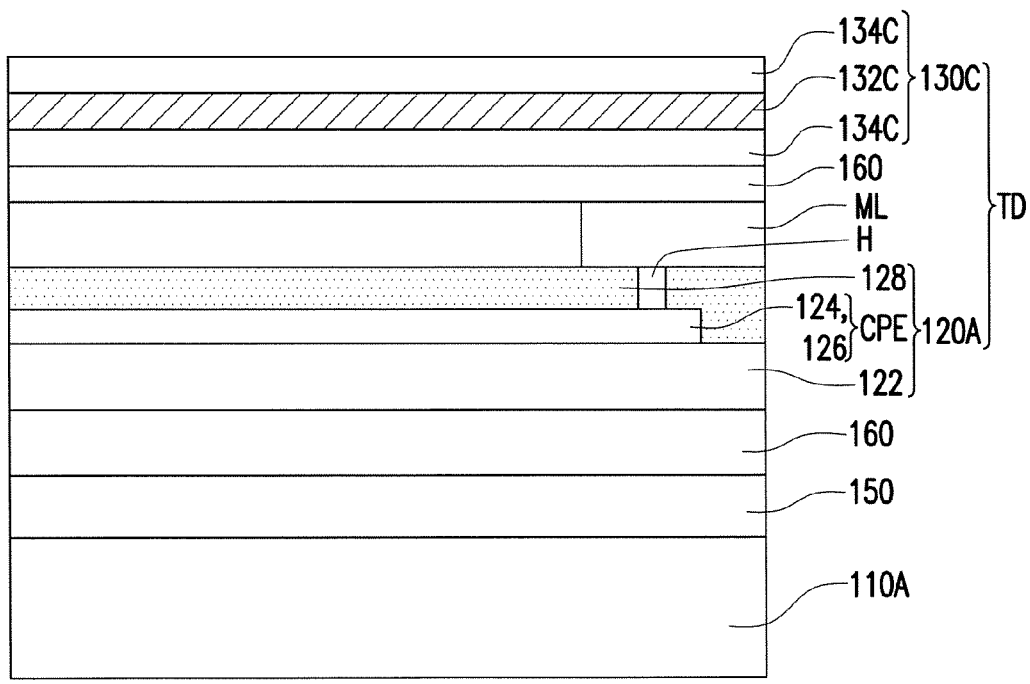

Referring to FIG. 1C, a touch organic light-emitting diode display device 100C of the embodiment in FIG. 1C is similar to the touch organic light-emitting diode display device 100A of the embodiment in FIG. 1A, of which elements and related descriptions can be referred to the touch organic light-emitting diode display device 100A of the embodiment in FIG. 1A, and is not repeated herein. The differences between the touch organic light-emitting diode display device 100C and the touch organic light-emitting diode display device 100A are described below. In the embodiment, the touch device TD of the touch organic light-emitting diode display device 100C includes the touch panel 120A and a linear polarizing layer 130C. The linear polarizing layer 130C is a linear polarizing sheet, for example, which includes a polymer layer 132C and two protective layers 134C, and the polymer layer 132C is located between the two protective layers 134C. In particular, the polymer layer 132C is a polyvinyl alcohol (PVA) thin film, for example, which is treated by stretching. Additionally, a material of the protective layers 134C is triacetyl cellulose (TAC), for example, and the protective layers 134C are used to protect the polymer layer 132C having hydrophilicity. In the embodiment, the touch organic light-emitting diode display device 100C and the touch device TD may also have similar effects described in the embodiment of FIG. 1A, which can resist the ambient light interference, and have a thin thickness.

Figure 1D:
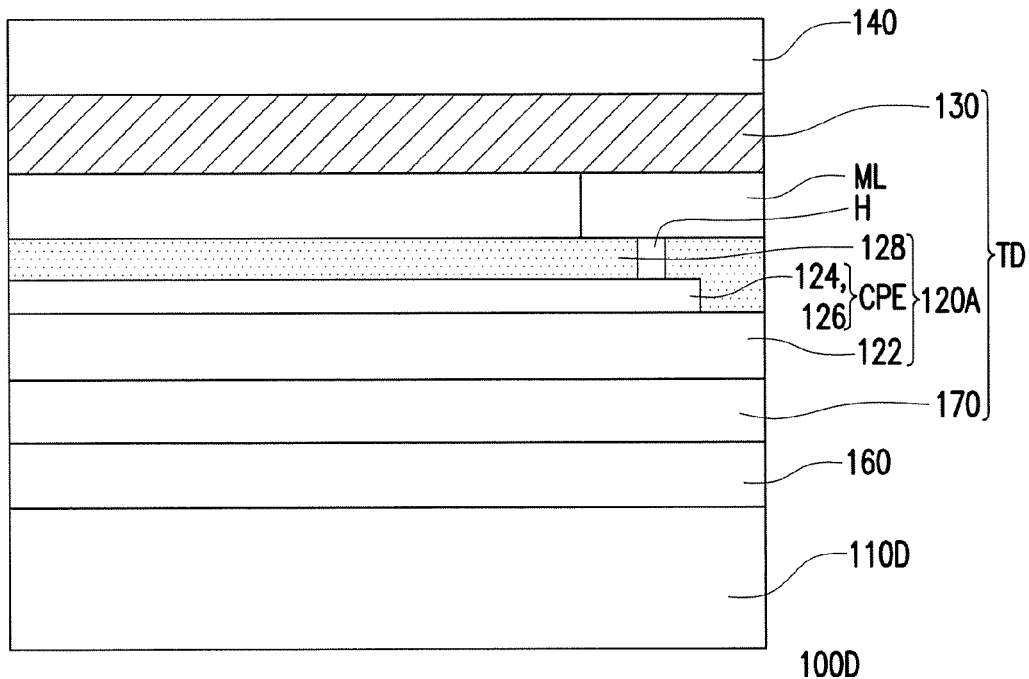

Referring to FIG. 1D, a touch organic light-emitting diode display device 100D of the embodiment in FIG. 1D is similar to the touch organic light-emitting diode display device 100A of the embodiment in FIG. 1A, of which elements and related descriptions can be referred to the touch organic light-emitting diode display device 100A of the embodiment in FIG. 1A, and is not repeated herein. The differences between the touch organic light-emitting diode display device 100D and the touch organic light-emitting diode display device 100A are described below. In the embodiment, an organic light-emitting diode display 110D of the touch organic light-emitting diode display device 100D has flexibility, which is disposed with a flexible circuit substrate (not shown). Additionally, the touch device TD of the touch organic light-emitting diode display device 100D further includes a barrier layer 170. The barrier layer 170 is disposed at one side of the touch panel 120A away from the linear polarizing layer 130, and is disposed between the organic light-emitting diode display 110D and the touch panel 120A to be used to prevent moisture and oxygen from entering the organic light-emitting diode display 110D. A conventional touch organic light-emitting diode display device having flexibility needs an encapsulating layer (e.g., encapsulated glass 150) additionally disposed between the organic light-emitting diode display and the touch panel to resist moisture and oxygen by comparison. The thickness of the touch organic light-emitting diode display device having a conventional on-cell embedded structure subtracted by the thickness of the organic light-emitting diode display is equal to about 273 micrometers, and the thickness of the touch organic light-emitting diode display device 100D of the embodiment subtracted by the thickness of the organic light-emitting diode display 110D is equal to about 111 micrometers. Thus, the thickness of the touch organic light-emitting diode display device 100D of the embodiment is reduced by 59.3% compared with that of the conventional structure. In the embodiment, the touch organic light-emitting diode display device 100D and the touch device TD may also have similar effects described in the embodiment of FIG. 1A, which can resist the ambient light interference, and have a thin thickness. Additionally, the touch organic light-emitting diode display device 100D has better elasticity, and the flexible curvature thereof is larger.

Figure 2:
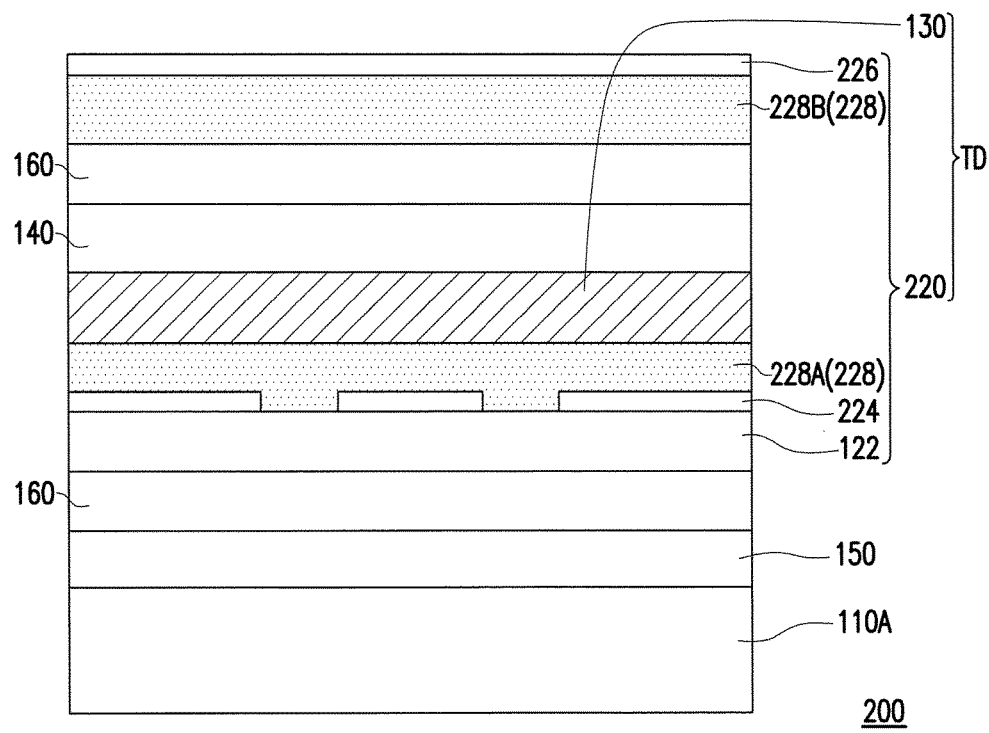
FIG. 2 is a schematic cross-sectional view illustrating a touch organic light-emitting diode display device according to another embodiment of the invention.

FIG. 2 is a schematic cross-sectional view illustrating a touch organic light-emitting diode display device according to another embodiment of the invention. Referring to FIG. 2, a touch organic light-emitting diode display device 200 of the embodiment in FIG. 2 is similar to the touch organic light-emitting diode display device 100A of the embodiment in FIG. 1A, of which elements and related descriptions can be referred to the touch organic light-emitting diode display device 100A of the embodiment in FIG. 1A, and is not repeated herein. The differences between the touch organic light-emitting diode display device 200 and the touch organic light-emitting diode display device 100A are described below. In the embodiment, the touch device TD of the touch organic light-emitting diode display device 200 includes a touch panel 220 and the linear polarizing layer 130. The touch panel 220 includes the substrate 122, a driving electrode 224, a sensing electrode 226, and a dielectric layer 228. The substrate 122 is disposed between the driving electrode 224 and the sensing electrode 226. The dielectric layer 228 includes a plurality of sub-dielectric layers 228A and 228B. The sub-dielectric layer 228A is connected to the driving electrode 224, and the sub-dielectric layer 228B is connected to the sensing electrode 226. In particular, the driving electrode 224 is disposed on the substrate 122, and the sub-dielectric layer 228A covers a surface of the driving electrode 224. Additionally, the linear polarizing layer 130 and the scratch resistant layer 140 are disposed on the sub-dielectric layer 228A, and the sub-dielectric layer 228B is disposed on the linear polarizing layer 130 and the scratch resistant layer 140. Also, the sensing electrode 226 covers a surface of the sub-dielectric layer 228B. In particular, the sub-dielectric layer 228B is located between the sensing electrode 226 and the linear polarizing layer 130. That is, the sensing electrode 226 is disposed at an outermost side of the touch organic light-emitting diode display device 200.

In the embodiment, the touch organic light-emitting diode display device 200 not only includes the adhesive layer 160 disposed between the touch panel 220 and the encapsulated glass 150 for adhering the touch panel 220 and the encapsulated glass 150, the touch organic light-emitting diode display device 200 but also includes another adhesive layer 160 disposed between the sub-dielectric layer 228B and the scratch resistant layer 140. In particular, in other embodiments, the sensing electrode 226 may also be disposed between the sub-dielectric layer 228B and the linear polarizing layer 130, and the adhesive layer 160 is disposed between the sensing electrode 226 and the scratch resistant layer 140. That is, the sub-dielectric layer 228B is disposed at the outermost side of the touch organic light-emitting diode display device 200. Additionally, in some embodiments, the substrate 122 may be disposed between the linear polarizing layer 130 and the driving electrode 224. In particular, the driving electrode 224 of the embodiments is disposed at one side of the substrate 122 away from the linear polarizing layer 130, which is different from the driving electrode 224 of the embodiment in FIG. 2, which is disposed at one side of the substrate 122 facing the linear polarizing layer 130. Furthermore, in some embodiments, the positions of the driving electrode 224 and the sensing electrode 226 may be exchanged, and the invention is not limited thereto.

In the embodiment, a configuration structure of the touch panel 220 and the organic light-emitting diode display 110A is an out-cell configuration structure, for example. Additionally, the sub-dielectric layers 228A and 228B have a one-eighth wavelength phase delay amount respectively. That is, the overall dielectric layer 228 has a one-quarter wavelength phase delay amount. In particular, the thickness of the touch organic light-emitting diode display device having a conventional out-cell configuration structure subtracted by the thickness of the organic light-emitting diode display is equal to about 383 micrometers, and the thickness of the touch organic light-emitting diode display device 200 of the embodiment subtracted by the thickness of the organic light-emitting diode display 110A is equal to about 171 micrometers. Thus, the thickness of the touch organic light-emitting diode display device 200 of the embodiment is reduced by 55.4% compared with that of the conventional structure. In the embodiment, the touch organic light-emitting diode display device 200 and the touch device TD may also have similar effects described in the embodiment of FIG. 1A, which can resist the ambient light interference, and have a thin thickness.

Figure 3A:
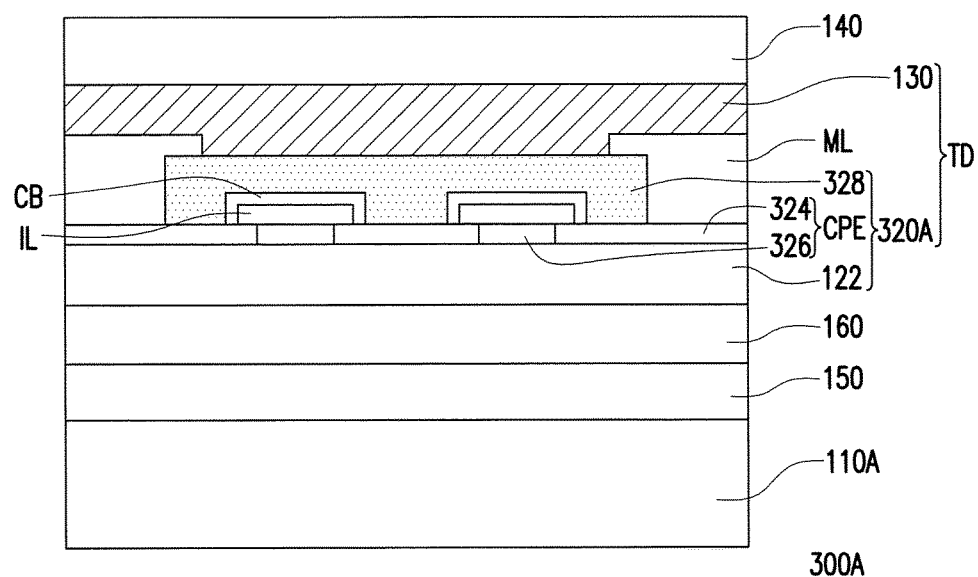
FIG. 3A to FIG. 3B are schematic cross-sectional views illustrating touch organic light-emitting diode display devices according to further some embodiments of the invention.
Figure 3B:
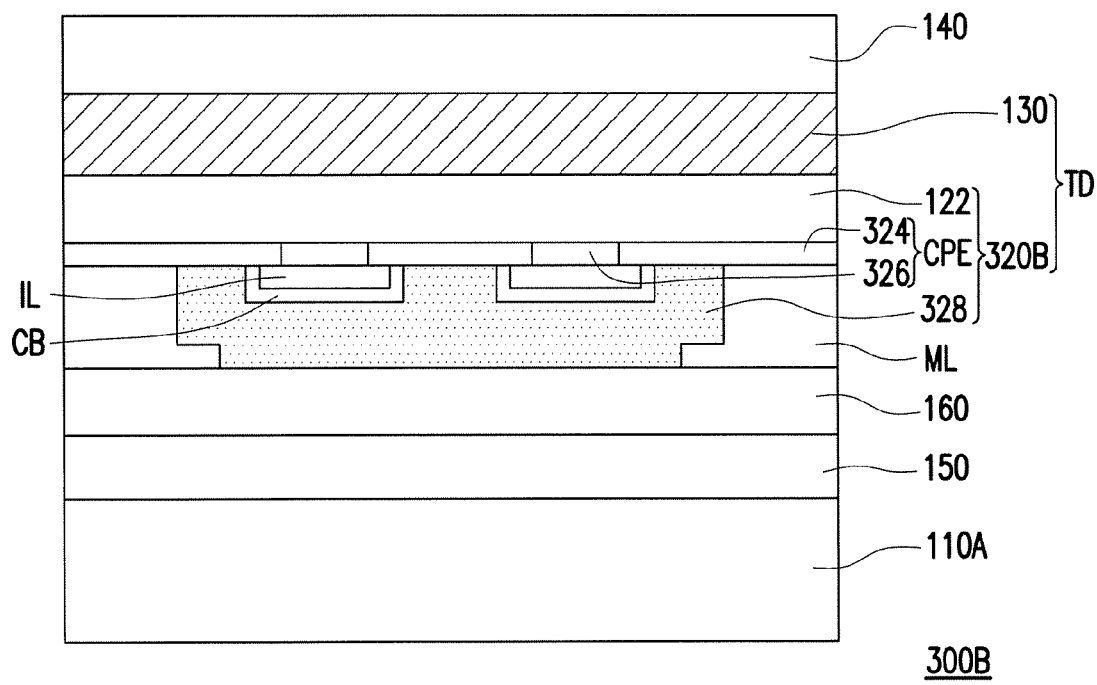

FIG. 3A to FIG. 3B are schematic cross-sectional views illustrating touch organic light-emitting diode display devices according to further some embodiments of the invention. Referring to FIG. 3A, a touch organic light-emitting diode display device 300A of the embodiment in FIG. 3A is similar to the touch organic light-emitting diode display device 100A of the embodiment in FIG. 1A, of which elements and related descriptions can be referred to the touch organic light-emitting diode display device 100A of the embodiment in FIG. 1A, and is not repeated herein. The differences between the touch organic light-emitting diode display device 300A and the touch organic light-emitting diode display device 100A are described below. The touch device TD of the touch organic light-emitting diode display device 300A includes a touch panel 320A and the linear polarizing layer 130. The touch panel 320A includes the substrate 122, a driving electrode 324, a sensing electrode 326, and a dielectric layer 328. In particular, the driving electrode 324 and the sensing electrode 326 of the embodiment belong to a single-sided ITO layer (SITO) electrode structure, for example. The driving electrode 324 and the sensing electrode 326 are the coplanar electrode layer CPE, and the driving electrode 324 and the sensing electrode 326 are disposed on a surface of the same side of the substrate 122. Additionally, a plurality of electrode patterns of the driving electrode 324 and a plurality of electrode patterns of the sensing electrode 326 are insulated from each other through an insulating layer IL, and the electrode patterns of the driving electrode 324 are electrically connected to each other through a conductive bridge CB.

In some embodiments, the positions of the driving electrode 324 and the sensing electrode 326 of the touch panel 320A may be exchanged. That is, the electrode patterns of the sensing electrode 326 are electrically connected to each other through the conductive bridge CB. Additionally, in some embodiments, the linear polarizing layer 130 and the scratch resistant layer 140 of the touch organic light-emitting diode display device 300A may also be replaced by the linear polarizing layer 130C of the embodiments in FIG. 1A or FIG. 1C, and the invention is not limited thereto. In particular, the thickness of the touch organic light-emitting diode display device 300A of the embodiment subtracted by the thickness of the organic light-emitting diode display 110A is equal to about 116 micrometers. Thus, the touch organic light-emitting diode display device 300A and the touch device TD have similar effects described in the embodiment of FIG. 1A, which can resist the ambient light interference, and have a thin thickness.

Additionally, in some embodiments, the touch device TD of the touch organic light-emitting diode display device 300A may further include the barrier layer 170 of the embodiment in FIG. 1D, which is used to prevent moisture and oxygen from entering the organic light-emitting diode display 110A. In particular, the thickness of the touch organic light-emitting diode display device 300A of the embodiments subtracted by the thickness of the organic light-emitting diode display 110A is equal to about 126 micrometers. Thus, the touch organic light-emitting diode display device 300A and the touch device TD of the embodiments have similar effects described in the embodiment of FIG. 1A, which can resist the ambient light interference, and have a thin thickness.

Referring to FIG. 3B, a touch organic light-emitting diode display device 300B of the embodiment in FIG. 3B is similar to the touch organic light-emitting diode display device 300A of the embodiment in FIG. 3A, of which elements and related descriptions can be referred to the touch organic light-emitting diode display device 300A of the embodiment in FIG. 3A, and is not repeated herein. The differences between the touch organic light-emitting diode display device 300B and the touch organic light-emitting diode display device 300A are described below. The touch device TD of the touch organic light-emitting diode display device 300B includes a touch panel 320B and the linear polarizing layer 130. The driving electrode 324 and the sensing electrode 326 of the touch panel 320B are the coplanar electrode layer CPE, and the substrate 122 is disposed between the linear polarizing layer 130 and the coplanar electrode layer CPE. In particular, the driving electrode 324 and the sensing electrode 326 of the embodiment are disposed at one side of the substrate 122 away from the linear polarizing layer 130, which is different from the driving electrode 324 and the sensing electrode 326 of the embodiment in FIG. 3A, which are disposed at one side of the substrate 122 facing the linear polarizing layer 130. In the embodiment, the touch organic light-emitting diode display device 300B and the touch device TD may also have similar effects described in the embodiment of FIG. 1A, which can resist the ambient light interference, and have a thin thickness.

Figure 4:
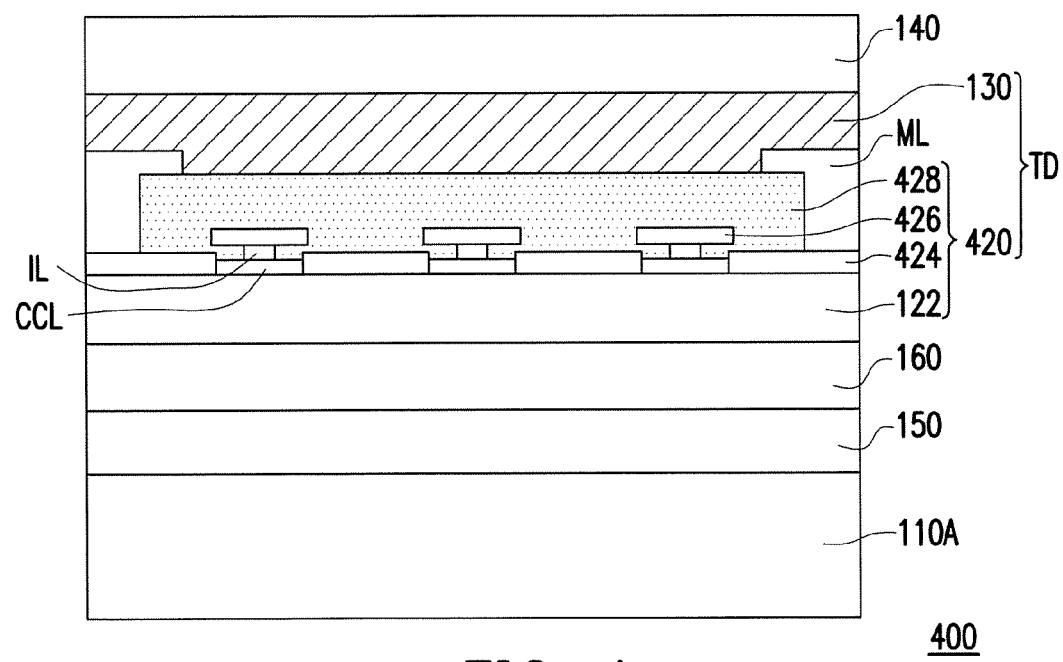
FIG. 4 is a schematic cross-sectional view illustrating a touch organic light-emitting diode display device according to yet another embodiment of the invention.

FIG. 4 is a schematic cross-sectional view illustrating a touch organic light-emitting diode display device according to yet another embodiment of the invention. Referring to FIG. 4, a touch organic light-emitting diode display device 400 of the embodiment in FIG. 4 is similar to the touch organic light-emitting diode display device 300A of the embodiment in FIG. 3A, of which elements and related descriptions can be referred to the touch organic light-emitting diode display device 300A of the embodiment in FIG. 3A, and is not repeated herein. The differences between the touch organic light-emitting diode display device 400 and the touch organic light-emitting diode display device 300A are described below. The touch device TD of the touch organic light-emitting diode display device 400 includes a touch panel 420 and the linear polarizing layer 130. The touch panel 420 includes the substrate 122, a driving electrode 424, a sensing electrode 426, and a dielectric layer 428. In the embodiment, the driving electrode 424 and the sensing electrode 426 are not the coplanar electrode layer CPE. A plurality of electrode patterns of the driving electrode 424 are electrically connected to each other through a conductive connection layer CCL. Additionally, the insulating layer IL is disposed between the plurality of electrode patterns of the sensing electrode 426 and the conductive connection layer CCL, and the insulating layer IL is used to insulate the driving electrode 424 from the sensing electrode 426. In particular, in some embodiments, the positions of the driving electrode 424 and the sensing electrode 426 may be exchanged, and the invention is not limited thereto. In the embodiment, the thickness of the touch organic light-emitting diode display device 400 subtracted by the thickness of the organic light-emitting diode display 110A is equal to about 116 micrometers. Thus, the touch organic light-emitting diode display device 400 and the touch device TD have similar effects described in the embodiment of FIG. 1A, which can resist the ambient light interference, and have a thin thickness.

In particular, in some embodiments, the substrate 122 of the touch panel 420 is disposed between the linear polarizing layer 130 and the driving electrode 424. In particular, the driving electrode 424 and the sensing electrode 426 of the embodiments are disposed at one side of the substrate 122 away from the linear polarizing layer 130, which is different from the driving electrode 424 and the sensing electrode 426 of the embodiment in FIG. 4, which are disposed at one side of the substrate 122 facing the linear polarizing layer 130. Additionally, in other embodiments, the linear polarizing layer 130 and the scratch resistant layer 140 of the touch organic light-emitting diode display device 400 may also be replaced by the linear polarizing layer 130C of the embodiments in FIG. 1A or FIG. 1C. Furthermore, in some embodiments, the touch device TD of the touch organic light-emitting diode display device 400 may further include the barrier layer 170 of the embodiment in FIG. 1D, which is used to prevent moisture and oxygen from entering the organic light-emitting diode display 110A. In particular, the thickness of the touch organic light-emitting diode display device 400 of the embodiments subtracted by the thickness of the organic light-emitting diode display 110A is equal to about 126 micrometers. Thus, the touch organic light-emitting diode display device 400 and the touch device TD of the embodiments have similar effects described in the embodiment of FIG. 1A, which can resist the ambient light interference, and have a thin thickness.

Figure 5:
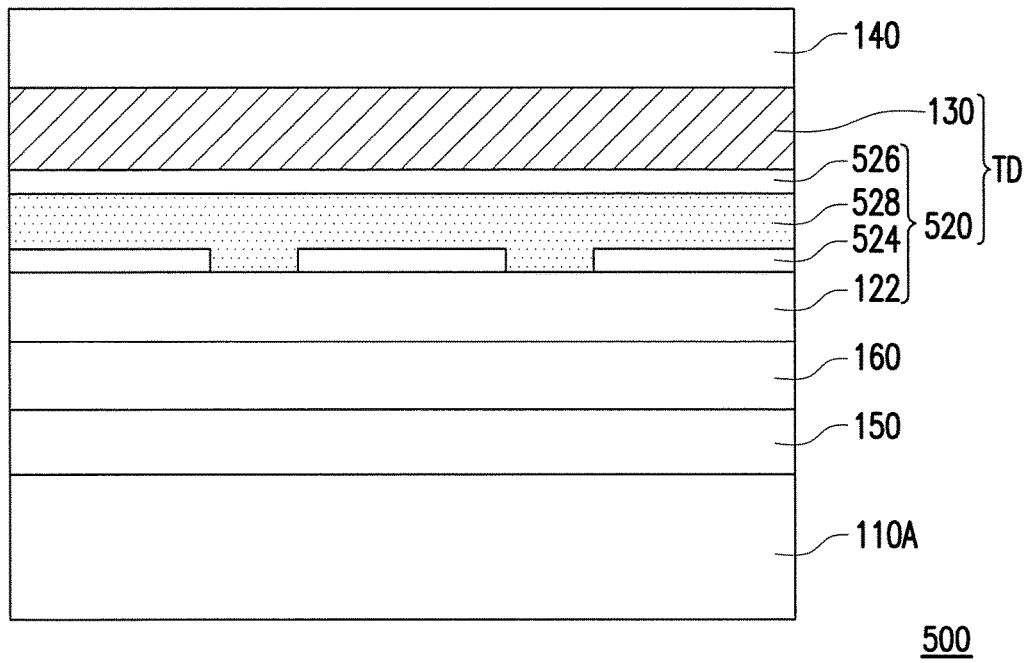
FIG. 5 is a schematic cross-sectional view illustrating a touch organic light-emitting diode display device according to yet another embodiment of the invention.

FIG. 5 is a schematic cross-sectional view illustrating a touch organic light-emitting diode display device according to yet another embodiment of the invention. Referring to FIG. 5, a touch organic light-emitting diode display device 500 of the embodiment in FIG. 5 is similar to the touch organic light-emitting diode display device 100A of the embodiment in FIG. 1A, of which elements and related descriptions can be referred to the touch organic light-emitting diode display device 100A of the embodiment in FIG. 1A, and is not repeated herein. The differences between the touch organic light-emitting diode display device 500 and the touch organic light-emitting diode display device 100A are described below. The touch device TD of the touch organic light-emitting diode display device 500 includes a touch panel 520 and the linear polarizing layer 130. The touch panel 520 includes the substrate 122, a driving electrode 524, a sensing electrode 526, and a dielectric layer 528. In particular, the driving electrode 524 and the sensing electrode 526 of the embodiment belong to a single-sided bilayer ITO layer electrode structure, for example. The driving electrode 524 and the sensing electrode 526 are disposed on the same side of the substrate 122 respectively, but the driving electrode 524 and the sensing electrode 526 are not the coplanar electrode layer CPE. In the embodiment, the dielectric layer 528 is disposed between the substrate 122 and the linear polarizing layer 130, and the dielectric layer 528 is disposed between the driving electrode 524 and the sensing electrode 526 to insulate the driving electrode 524 from the sensing electrode 526. One of the driving electrode 524 and the sensing electrode 526 is disposed at one side of the dielectric layer 528 close to the substrate 122, and the other one of the driving electrode 524 and the sensing electrode 526 is disposed at one side of the dielectric layer 528 away from the substrate 122. In particular, the driving electrode 524 is disposed between the dielectric layer 528 and the substrate 122, and the sensing electrode 526 is disposed between the linear polarizing layer 130 and the dielectric layer 528. However, in some embodiments, the positions of the driving electrode 524 and the sensing electrode 526 may be exchanged, and the invention is not limited thereto.

Additionally, in some embodiments, the substrate 122 is disposed between the linear polarizing layer 130 and the driving electrode 524. In particular, the driving electrode 524 and the sensing electrode 526 of the embodiments are disposed at one side of the substrate 122 away from the linear polarizing layer 130, which is different from the driving electrode 524 and the sensing electrode 526 of the embodiment in FIG. 5, which are disposed at one side of the substrate 122 facing the linear polarizing layer 130. Additionally, in other embodiments, the linear polarizing layer 130 and the scratch resistant layer 140 of the touch organic light-emitting diode display device 500 may also be replaced by the linear polarizing layer 130C of the embodiments in FIG. 1A or FIG. 1C, and the invention is not limited thereto. In particular, the thickness of the touch organic light-emitting diode display device 500 of the embodiment subtracted by the thickness of the organic light-emitting diode display 110A is equal to about 101 micrometers. Thus, the touch organic light-emitting diode display device 500 and the touch device TD have similar effects described in the embodiment of FIG. 1A, which can resist the ambient light interference, and have a thin thickness.

Additionally, in some embodiments, the touch device TD of the touch organic light-emitting diode display device 500 may further include the barrier layer 170 of the embodiment in FIG. 1D, which is used to prevent moisture and oxygen from entering the organic light-emitting diode display 110A. In particular, the thickness of the touch organic light-emitting diode display device 500 of the embodiments subtracted by the thickness of the organic light-emitting diode display 110A is equal to about 111 micrometers. Thus, the touch organic light-emitting diode display device 500 and the touch device TD of the embodiments have similar effects described in the embodiment of FIG. 1A, which can resist the ambient light interference, and have a thin thickness.

Figure 6:
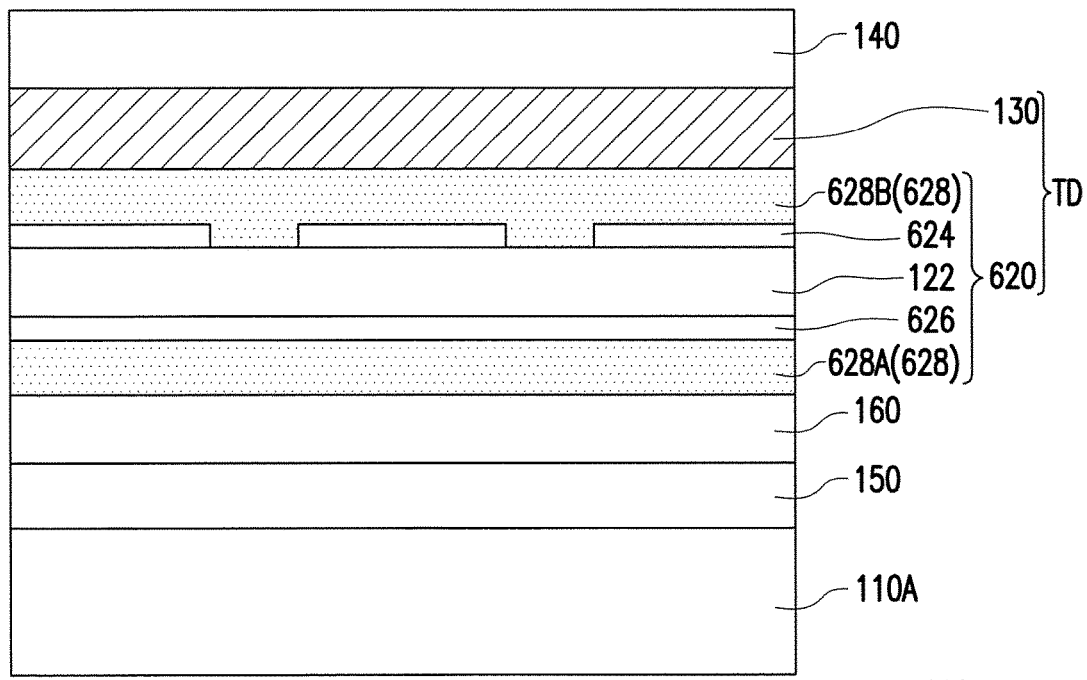
FIG. 6 is a schematic cross-sectional view illustrating a touch organic light-emitting diode display device according to yet another embodiment of the invention.

FIG. 6 is a schematic cross-sectional view illustrating a touch organic light-emitting diode display device according to yet another embodiment of the invention. Referring to FIG. 6, a touch organic light-emitting diode display device 600 of the embodiment in FIG. 6 is similar to the touch organic light-emitting diode display device 100A of the embodiment in FIG. 1A, of which elements and related descriptions can be referred to the touch organic light-emitting diode display device 100A of the embodiment in FIG. 1A, and is not repeated herein. The differences between the touch organic light-emitting diode display device 600 and the touch organic light-emitting diode display device 100A are described below. The touch device TD of the touch organic light-emitting diode display device 600 includes a touch panel 620 and the linear polarizing layer 130. The touch panel 620 includes the substrate 122, a driving electrode 624, a sensing electrode 626, and a dielectric layer 628. The substrate 122 is disposed between the driving electrode 624 and the sensing electrode 626. The dielectric layer 628 includes a plurality of sub-dielectric layers 628A and 628B. The sub-dielectric layer 628B is connected to the driving electrode 624, and the sub-dielectric layer 628A is connected to the sensing electrode 626. In particular, the driving electrode 624 and the sensing electrode 626 of the embodiment belong to a double-sided ITO layer (DITO) electrode structure, for example. The driving electrode 624 and the sensing electrode 626 are located at two sides of the substrate 122 respectively. The sub-dielectric layer 626B covers a surface of the driving electrode 624, and the sub-dielectric layer 626A covers a surface of the sensing electrode 626. Additionally, the linear polarizing layer 130 and the scratch resistant layer 140 are disposed above the sub-dielectric layer 626B. Additionally, in the embodiment, the sub-dielectric layers 628A and 628B have a one-eighth wavelength phase delay amount respectively. That is, the overall dielectric layer 628 has a one-quarter wavelength phase delay amount.

In some embodiments, the positions of the driving electrode 624 and the sensing electrode 626 of the touch panel 620 may be exchanged. Additionally, in other embodiments, the linear polarizing layer 130 and the scratch resistant layer 140 of the touch organic light-emitting diode display device 600 may also be replaced by the linear polarizing layer 130C of the embodiments in FIG. 1A or FIG. 1C, and the invention is not limited thereto. In particular, the thickness of the touch organic light-emitting diode display device 600 of the embodiment subtracted by the thickness of the organic light-emitting diode display 110A is equal to about 106 micrometers. Thus, the touch organic light-emitting diode display device 600 and the touch device TD have similar effects described in the embodiment of FIG. 1A, which can resist the ambient light interference, and have a thin thickness.

Additionally, in some embodiments, the touch device TD of the touch organic light-emitting diode display device 600 may further include the barrier layer 170 of the embodiment in FIG. 1D, which is used to prevent moisture and oxygen from entering the organic light-emitting diode display 110A. In particular, the thickness of the touch organic light-emitting diode display device 600 of the embodiments subtracted by the thickness of the organic light-emitting diode display 110A is equal to about 116 micrometers. Thus, the touch organic light-emitting diode display device 600 and the touch device TD of the embodiments have similar effects described in the embodiment of FIG. 1A, which can resist the ambient light interference, and have a thin thickness.

In summary, the embodiments of the invention have at least one of the advantages or effects below. In the touch organic light-emitting diode display device of the embodiment of the invention, the dielectric layer is connected to at least one of the driving electrode and the sensing electrode. The dielectric layer has the one-quarter wavelength phase delay amount, and the dielectric layer is formed by coating. Therefore, the dielectric layer can be used with the linear polarizing layer to realize circular polarization, thereby eliminating the ambient light reflected by the organic light-emitting diode display, so that the touch organic light-emitting diode display device can resist the ambient light interference. Additionally, since an extra one-quarter wavelength phase retardation film is not required to be attached to the touch organic light-emitting diode display device, the touch organic light-emitting diode display device has a thin thickness. Besides, when the touch device of the embodiment of the invention is used combined with the display, the dielectric layer of the touch device can be used with the linear polarizing layer to realize circular polarization, thereby eliminating the ambient light reflected by the display, so as to resist the ambient light interference. Additionally, the touch device has a thin thickness.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A touch organic light-emitting diode display device, comprising:
    an organic light-emitting diode display;
    a touch panel, disposed on the organic light-emitting diode display, the touch panel comprising:
        a substrate;
        a driving electrode, disposed at the substrate, the driving electrode being adapted to transmit a driving signal;
        a sensing electrode, adapted to receive a sensing signal, and the driving electrode and the sensing electrode being disposed to be insulated from each other; and
        a dielectric layer, connected to at least one of the driving electrode and the sensing electrode, the dielectric layer having a one-quarter wavelength phase delay amount, and the dielectric layer being formed by coating; and
    a linear polarizing layer, disposed at one side of the touch panel away from the organic light-emitting diode display.

2. The touch organic light-emitting diode display device according to claim 1, wherein the driving electrode and the sensing electrode are a coplanar electrode layer, and the coplanar electrode layer is disposed between the linear polarizing layer and the substrate.

3. The touch organic light-emitting diode display device according to claim 1, wherein the driving electrode and the sensing electrode are a coplanar electrode layer, and the substrate is disposed between the linear polarizing layer and the coplanar electrode layer.

4. The touch organic light-emitting diode display device according to claim 1, wherein one of the driving electrode and the sensing electrode is disposed at one side of the dielectric layer close to the substrate, and the other one of the driving electrode and the sensing electrode is disposed at one side of the dielectric layer away from the substrate.

5. The touch organic light-emitting diode display device according to claim 1, wherein the substrate is disposed between the driving electrode and the sensing electrode, the dielectric layer comprises a plurality of sub-dielectric layers, one of the sub-dielectric layers is connected to the driving electrode, and another one of the sub-dielectric layers is connected to the sensing electrode.

6. The touch organic light-emitting diode display device according to claim 5, wherein the sub-dielectric layers have a one-eighth wavelength phase delay amount respectively.

7. The touch organic light-emitting diode display device according to claim 1, further comprising a barrier layer, disposed between the organic light-emitting diode display and the touch panel.

8. A touch device, comprising:
    a touch panel, comprising:
        a substrate;
        a driving electrode, disposed at the substrate, the driving electrode being adapted to transmit a driving signal;
        a sensing electrode, adapted to receive a sensing signal, and the driving electrode and the sensing electrode being disposed to be insulated from each other; and
        a dielectric layer, connected to at least one of the driving electrode and the sensing electrode, the dielectric layer having a one-quarter wavelength phase delay amount, and the dielectric layer being formed by coating; and
    a linear polarizing layer, disposed on the touch panel.

9. The touch device according to claim 8, wherein the driving electrode and the sensing electrode are a coplanar electrode layer, and the coplanar electrode layer is disposed between the linear polarizing layer and the substrate.

10. The touch device according to claim 8, wherein the driving electrode and the sensing electrode are a coplanar electrode layer, and the substrate is disposed between the linear polarizing layer and the coplanar electrode layer.

11. The touch device according to claim 8, wherein one of the driving electrode and the sensing electrode is disposed at one side of the dielectric layer close to the substrate, and the other one of the driving electrode and the sensing electrode is disposed at one side of the dielectric layer away from the substrate.

12. The touch device according to claim 8, wherein the substrate is disposed between the driving electrode and the sensing electrode, the dielectric layer comprises a plurality of sub-dielectric layers, one of the sub-dielectric layers is connected to the driving electrode, and another one of the sub-dielectric layers is connected to the sensing electrode.

13. The touch device according to claim 12, wherein the sub-dielectric layers have a one-eighth wavelength phase delay amount respectively.

14. The touch device according to claim 8, further comprising a barrier layer, disposed at one side of the touch panel away from the linear polarizing layer.

* * * * *